(12) United States Patent
Jordanger et al.

(10) Patent No.: US 6,590,436 B2
(45) Date of Patent: Jul. 8, 2003

(54) SYSTEM AND METHOD OF TRANSLATING WIDE COMMON MODE VOLTAGE RANGES INTO NARROW COMMON MODE VOLTAGE RANGES

(75) Inventors: Ricky Dale Jordanger, Allen, TX (US); Vinodh K. Nalluri, Visakha (IN); Srikanth Gondi, Chennai (IN); Steven Graham Brantley, Satellite Beach, FL (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/976,510

(22) Filed: Oct. 12, 2001

(65) Prior Publication Data

US 2003/0071673 A1 Apr. 17, 2003

(51) Int. Cl.[7] .................................................. H03F 3/45
(52) U.S. Cl. ......................... 327/333; 327/67; 330/144
(58) Field of Search ............................. 327/65, 67, 68, 327/333, 560, 563; 330/144, 258

(56) References Cited

U.S. PATENT DOCUMENTS

| | | | | |
|---|---|---|---|---|
| 4,879,521 A | * | 11/1989 | Bredemann et al. | 330/258 |
| 5,043,675 A | * | 8/1991 | Gilbert | 330/258 |
| 5,095,282 A | * | 3/1992 | Dayton | 330/258 |
| 5,338,987 A | | 8/1994 | Tomasetti et al. | 327/108 |
| 5,390,038 A | | 2/1995 | Cecchini | 359/113 |
| 5,486,777 A | | 1/1996 | Nguyen | 326/68 |
| 6,362,682 B2 | * | 3/2002 | Shulman | 327/563 |
| 6,411,165 B1 | * | 6/2002 | Delano | 330/258 |

* cited by examiner

Primary Examiner—Timothy P. Callahan
Assistant Examiner—Terry L. Englund
(74) Attorney, Agent, or Firm—W. Daniel Swayze, Jr.; W. James Brady; Frederick J. Telecky, Jr.

(57) ABSTRACT

A system and method is provided for translating a wide common mode voltage range into a narrow common mode voltage range. The system and method extend the common mode voltage range of functional devices beyond the supply rails of the functional device, while keeping the differential signal loss to a minimum. The system and method translate a common mode input signal from a wide common mode voltage range into a narrow common mode voltage range utilizing a feedback technique.

12 Claims, 8 Drawing Sheets

SYSTEM AND METHOD OF TRANSLATING WIDE COMMON MODE VOLTAGE RANGES INTO NARROW COMMON MODE VOLTAGE RANGES

TECHNICAL FIELD

The present invention relates to electrical circuits and more particularly to a system and method for adjusting common mode voltage ranges on a differential input device.

BACKGROUND OF INVENTION

A functional differential input device, such as a data communication receiver, an operational amplifier or a comparator, has a differential input that can accommodate only a particular range of common mode voltage signal. However, the actual common mode signal range presented to the device could be quite wide due to several external uncontrollable factors. Conventional data communication transceivers use a differential comparator input circuit to sense differential signals overlapped on a common mode signal. Typically, the common mode signal level required for reliable operation of the input stage of the functional device needs to be such that the input network is within a required common mode voltage range. The differential signal level presented to the input network needs to be substantially greater than the differential noise/error signal level.

One particular conventional device for maintaining a particular common mode voltage range utilizes a prototypical input stage differential transistor pair tied to the common mode signal input through a resistor network. The resistor network senses the difference in voltage between the applied voltage and a reference voltage. The difference in voltage is then translated to an input comparator based on the ratio of resistor divider pairs in the resistor network. The common mode signal at the inputs is adjusted by the resistor divider pairs of the resistor network. Essentially, the resistor divider pairs translate the common mode signal to a value that can be accommodated by the functional circuit. While widely applicable and well suited for many applications, the resistor common mode conversion has some drawbacks. For example, the differential signal is attenuated along with the common mode signal to a low signal level. When used for common mode applications much beyond the supply voltages, the differential signal suffers substantial attenuation due to high resistor ratio requirements on the resistor divider pairs. The high resistor divide ratio is unavoidable due to the requirement of wide common mode signal translation.

Some receiver types or interface circuits are designed to meet one of several interface standards. The Electronics Industry Associates (EIA) has developed several standards to simplify the interface in data communication application. One standard type method is single ended type, while another standard type method is differential which uses two signal lines. Differential data transmission standards are often the choice for transmitting over long distances and through noisy environments. These types of data communication applications require that receivers handle wide variations in common mode voltages. For example, the RS-442 (TIA/EIA-422-B, adopted in 1994) and the RS-485 (EIA RS-485, adopted in 1994) standard for data communication requires that the receiver or interface circuit be capable of handling wide common mode swings in the −7V to 12V range.

However, for industrial applications that require wide tolerances on bus voltage variation, the receiver circuitry needs to be capable of handling common mode variations that are substantially higher than the −7V to 12V range. Existing design techniques for RS-442 and RS-485 devices are not equipped to handle such wide common mode variations. Several issues like differential signal attenuation and offset/mismatch errors exist with the current topologies which limits the ability to accommodate wide common mode variations.

SUMMARY OF INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present invention provides for a system and methodology to translate a wide common mode voltage range into a narrow common mode voltage range. The present invention accomplishes this task by detecting and adjusting the wide common mode voltage range into a narrow common mode voltage range with minimal loss of differential voltage signal. A feedback technique is employed to extend the common mode voltage range of existing differential devices, such as a receiver, an operational amplifier, a comparator or other functional device operable to receive a differential input signal and a common mode input signal. The wide common mode voltage level is translated to a narrow common mode voltage level that can be accommodated by the differential input of a functional circuit. The technique minimizes the differential signal loss while achieving the above mentioned common mode signal translation. The system and method provide for a fast common mode translation system that can be employed for use with a variety of differential devices.

In one aspect of the invention, an attenuator network, a common mode voltage sensing device and a negative feedback system are employed to provide a system for translating a wide common mode voltage signal into a narrow common mode voltage signal. The common mode voltage sensing device detects the common mode voltage on the differential input of a functional circuit. The common mode voltage sensing device provides an output that is a reference voltage or an output that is an error signal that modifies or dynamically adjusts the reference voltage depending on the particular implementation being employed. The output of the common mode voltage sensing apparatus is then fed to a feedback amplifier stage. The amplifier stage sets a reference control voltage based on a reference voltage that is set, adjusted and controlled by the common mode voltage sensing device. The reference control voltage along with the voltage attenuator network modifies the applied wide common mode voltage to a required narrow common mode voltage.

The voltage sensing apparatus can be employed using resistor devices, such as a resistor divider structure. Alternatively, high impedance Metal-Oxide-Semiconductors (MOS) devices are employed to provide a voltage sensing apparatus. One particular MOS device can be a current comparator that converts the common mode voltage signal to a current. The current is then compared with a reference current to provide a current error signal (e.g., $I_{ERROR}$) relative to the common mode input signal. Another MOS device can be a pair of inverter circuits coupled to one another and the input of the attenuation network. The inverter circuits can employ current sources to generate a current error signal relative to the common mode input signal.

The following description and the annexed drawings set forth certain illustrative aspects of the invention. These aspects are indicative, however, of but a few of the various ways in which the principles of the invention may be employed. Other advantages and novel features of the invention will become apparent from the following detailed description of the invention when considered in conjunction with the drawings.

DETAILED DESCRIPTION OF THE INVENTION

The present invention will be described with reference to a system and method for translating a wide common mode voltage range into a narrow common mode voltage range. The system and method extend the common mode voltage range of functional devices (e.g., data receivers, operational amplifiers, comparators) beyond the supply rails of the functional device, while keeping the differential signal loss to a minimum. The system and method detect and measure a wide common mode voltage range input signal and adjust the input signal into a narrow common mode voltage range utilizing a feedback technique. Previous common mode translation topologies employ either active or passive networks where the differential signal loss is proportional to the common mode signal attenuation. The system and method of the present invention actively attenuates the common mode signal, while keeping the differential signal attenuation constant. As a result higher noise immunity is achieved without compromising the wide common mode signal capability.

In one aspect of the invention, a system and method is provided utilizing an attenuation network (e.g., resistive voltage dividers) and a negative feedback mechanism to translate a wide common mode voltage signal range to a narrow common mode voltage signal range. In one aspect of the invention, a wide common mode input voltage is presented to a resistor divider that has voltage taps that provide the common mode voltage to a differential input stage of a functional circuit. The common mode voltage range provided to the differential input stage of the functional circuit is set by the resistor voltage divider and a reference control voltage. The reference control voltage is adjusted by means of a feedback system that detects any variation on the applied wide common mode signal. A varying control voltage on the resistor attenuator effectively translates the wide common mode voltage range into a required narrow common mode voltage range.

Figure 1:
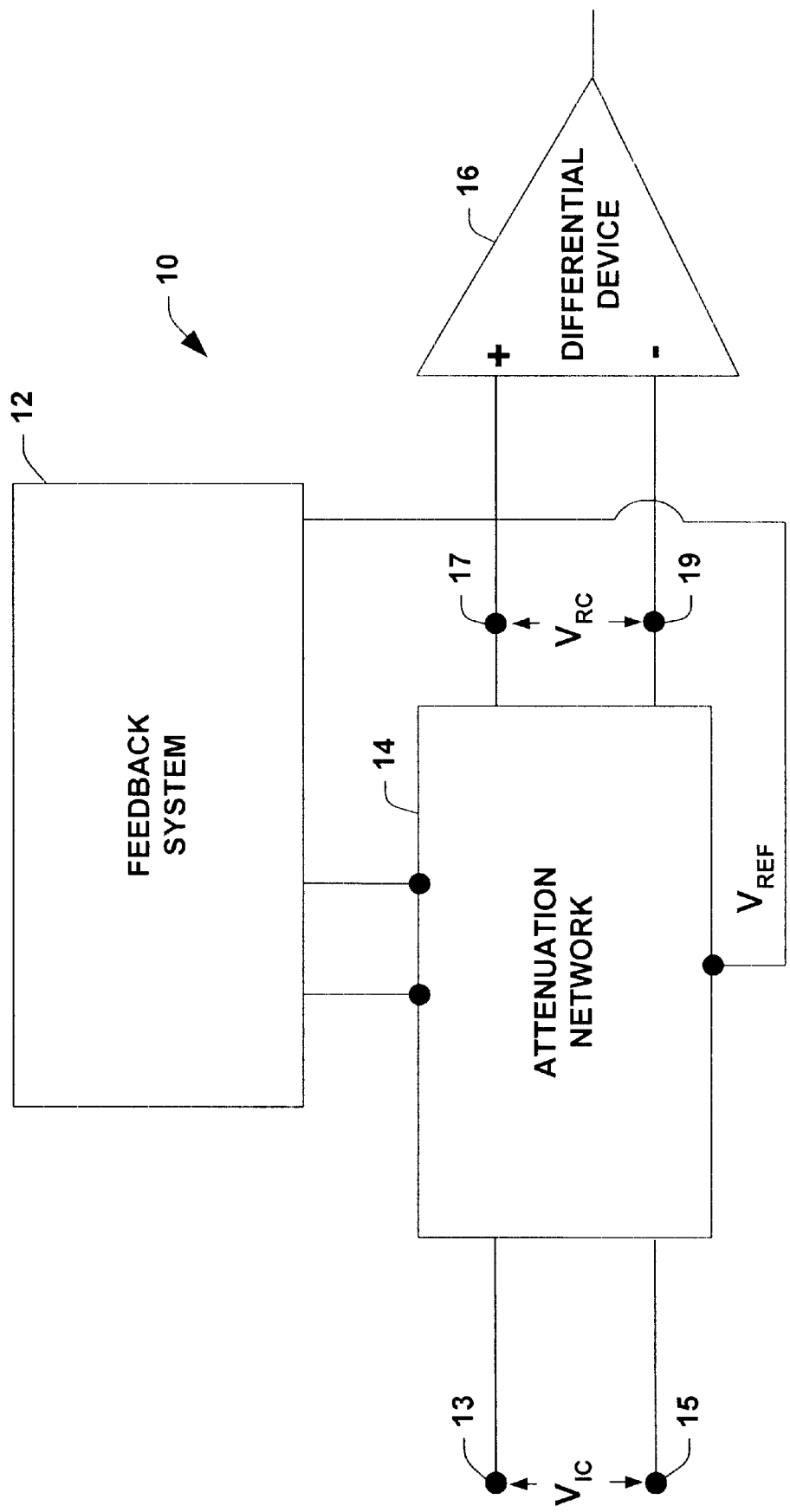
FIG. 1 illustrates a functional block diagram of a common mode translation system in accordance with an aspect of the present invention.

FIG. 1 is a schematic block diagram illustrating a common mode translation system 10 in accordance with an aspect of the present invention. The common mode translation system 10 comprises an attenuation network 14 and a feedback system 12. An external input common mode voltage $V_{IC}$ is provided at a pair of input terminals 13 and 15 of the attenuation network 14. The attenuation network 14 translates the common mode input voltage $V_{IC}$ into a reduced or bias voltage $V_{RC}$, which is provided at output terminals 17 and 19 of the attenuation network 14. The output terminals 17 and 19 are coupled to input terminals of a differential device 16 (e.g., receiver, operational amplifier, comparator). A reference control voltage $V_{REF}$ and an attenuation ratio set by the attenuation network 14 translate the common mode voltage $V_{IC}$ into an internal or adjusted common mode voltage $V_{RC}$. The feedback network 12 measures the voltage level of the common mode input voltage to the differential device 16. The feedback network 12 then dynamically adjusts the reference control voltage $V_{REF}$, such that the common mode input voltage to the differential device is reduced to within the working range of the differential device 16. In one aspect of the invention, the $V_{REF}$ reference control voltage varies in an inversely proportional relation to the common mode input voltages $V_{IC}$ and $V_{RC}$.

It is to be appreciated that the attenuation network 14 and the feedback system 12 can be employed utilizing hardware, software or a combination of software and hardware. It is also to be appreciated that the common mode translation system described in FIG. 1 can be integrated into a single device or circuit or be comprised of several devices. The following examples will be illustrated with respect to a common mode translation apparatus or circuit for transforming a wide common mode voltage range into a narrow common mode voltage range for a receiver apparatus or device. However, it is to be appreciated that the common mode translation technique of the present invention can be employed in a variety of differential devices of which the common mode voltage range is an important factor to consider. In some examples, a receiver device is provided operable to receive signals conforming to the RS-485 or the RS-422 standard. Other receiver types can employ the present invention to other types of standards to reduce a wide common mode input range to a narrow common mode input range. The variations and receiver types would be apparent to those skilled in the art.

Figure 2:
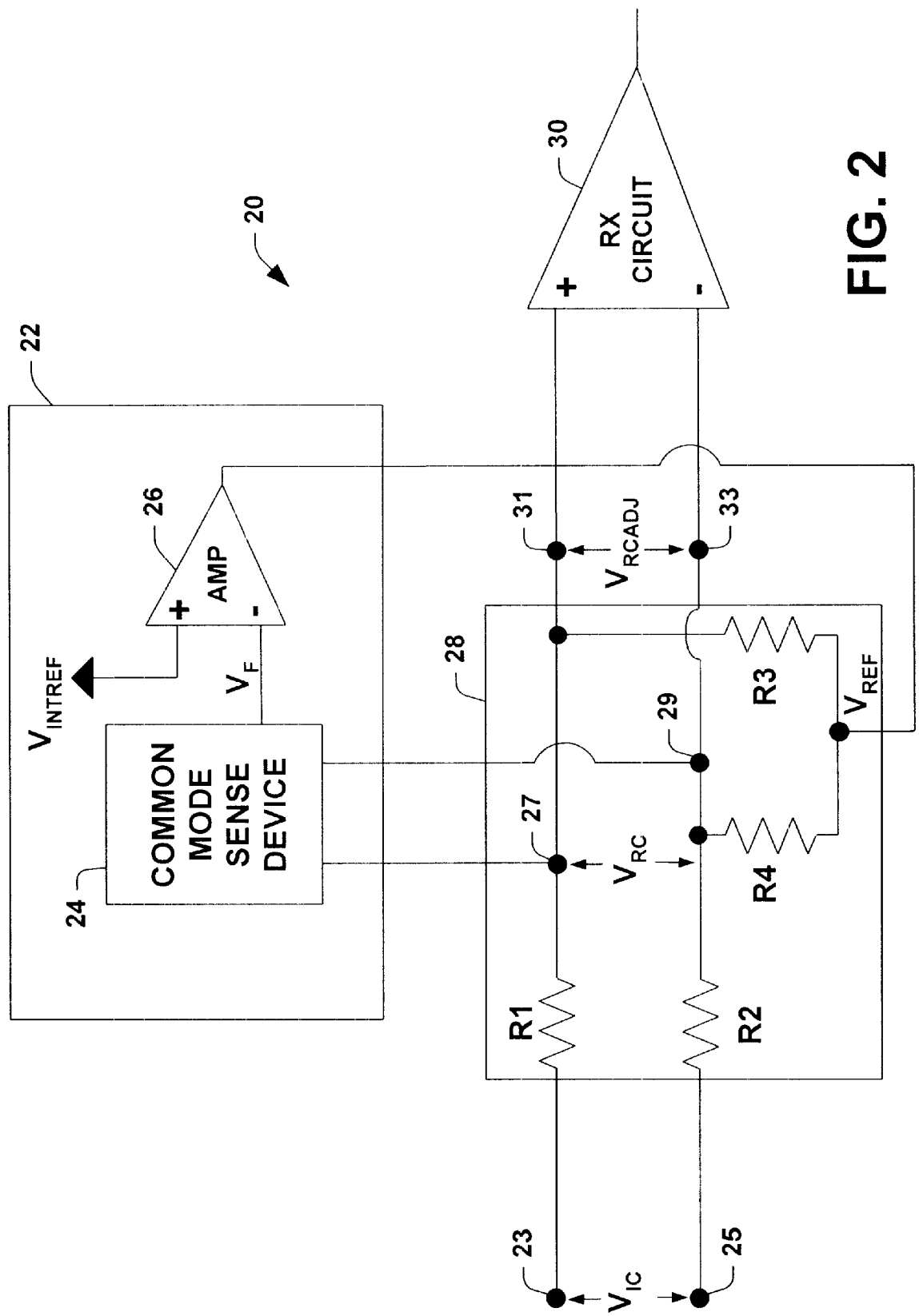
FIG. 2 illustrates a schematic block diagram of a receiver apparatus in accordance with an aspect of the present invention.

FIG. 2 illustrates a receiver apparatus 20 in accordance with an aspect of the present invention. The receiver apparatus 20 of FIG. 2 includes a voltage attenuation network 28 having resistors R1, R2, R3 and R4. The receiver apparatus 20 includes a feedback system 22 having a common mode sense device 24 coupled to an amplifier 26. An external input common mode voltage $V_{IC}$ is provided to the voltage attenuation network 28 at input terminals 23 and 25, which are coupled to resistors R1 and R2, respectively. Resistor R1 is also coupled to resistor R3 forming a first resistor divider and resistor R2 is also coupled to resistor R4 forming a second resistor divider. Resistor R1 and resistor R2 have substantially the same resistance, while the resistor R3 and the resistor R4 have substantially the same resistance. The input common mode voltage $V_{IC}$ is reduced to an internal common mode bias voltage $V_{RC}$ at internal nodes 27 and 29 by the first and second resistor divider pair.

The feedback system 22 translates the internal common mode bias voltage $V_{RC}$ into an adjusted internal common mode bias voltage $V_{RCADJ}$, which is provided to the differential input of a receiver circuit 30. It is to be appreciated that the internal common mode bias voltage $V_{RC}$ and the adjusted internal common mode bias voltage $V_{RCADJ}$ are essentially the same voltage separated by an adjustment time period. However, the internal common mode bias voltage $V_{RC}$ and the adjusted internal common mode bias voltage $V_{RCADJ}$ are shown as separate voltages for illustrative purposes. The adjustment time period does not affect the functionality of the receiving circuit 30 due to internal protection devices such as diode clamps or the like. A reference control voltage $V_{REF}$ and an attenuation ratio set by the first and second resistor divider pairs control the translation of the common mode input voltage $V_{IC}$ into an adjusted internal common mode voltage $V_{RCADJ}$.

The feedback system 22 includes the common mode sense device 24 coupled to the amplifier 26. The common mode input voltage $V_{RC}$ is sensed by the common mode sense device 24, which provides a voltage reference $V_F$ relative to the sensed common mode input voltage to the feedback amplifier 26. The voltage of the voltage reference $V_F$ moves in an opposite direction with respect to the input common mode voltage $V_{RC}$. The common mode sense device 24 and the feedback amplifier 26 dynamically modify the $V_{REF}$ control voltage based on the common mode input signal $V_{RC}$. An internal reference voltage $V_{INTREF}$ provides the reference bias voltage to the amplifier 26. The feedback amplifier 26 provides a buffered $V_F$ voltage that corresponds to the reference control voltage $V_{REF}$. The $V_{REF}$ control voltage varies in an inversely proportional relation to the common mode internal voltage $V_{RC}$. Therefore, the $V_{REF}$ control voltage will increase if the internal common mode voltage $V_{RC}$ decreases and the $V_{REF}$ control voltage will decrease if the internal common mode voltage $V_{RC}$ increases.

The ratio between R1 and R3, and R2 and R4 of FIG. 2 can be kept low and, thus, more differential signal made available at $V_{RC}$ employing the feedback technique in accordance with the present invention. The lower ratio leads to higher data signaling rates at wider external common mode ranges (e.g., −20 to +25V for RS-485 devices or RS-422 devices) versus prior art attenuators (e.g., −7 to +12V for RS-485 devices or RS-422 devices). Conventional translation devices require higher ratios between R1 and R3 and between R2 and R4 of FIG. 2 in order to keep the $V_{RC}$ voltage in the common mode range of the receiver circuit. This leads to smaller available differential signal at $V_{RC}$ and, thus, lower data rates using conventional attenuators at a wider external common mode range.

Figure 3:
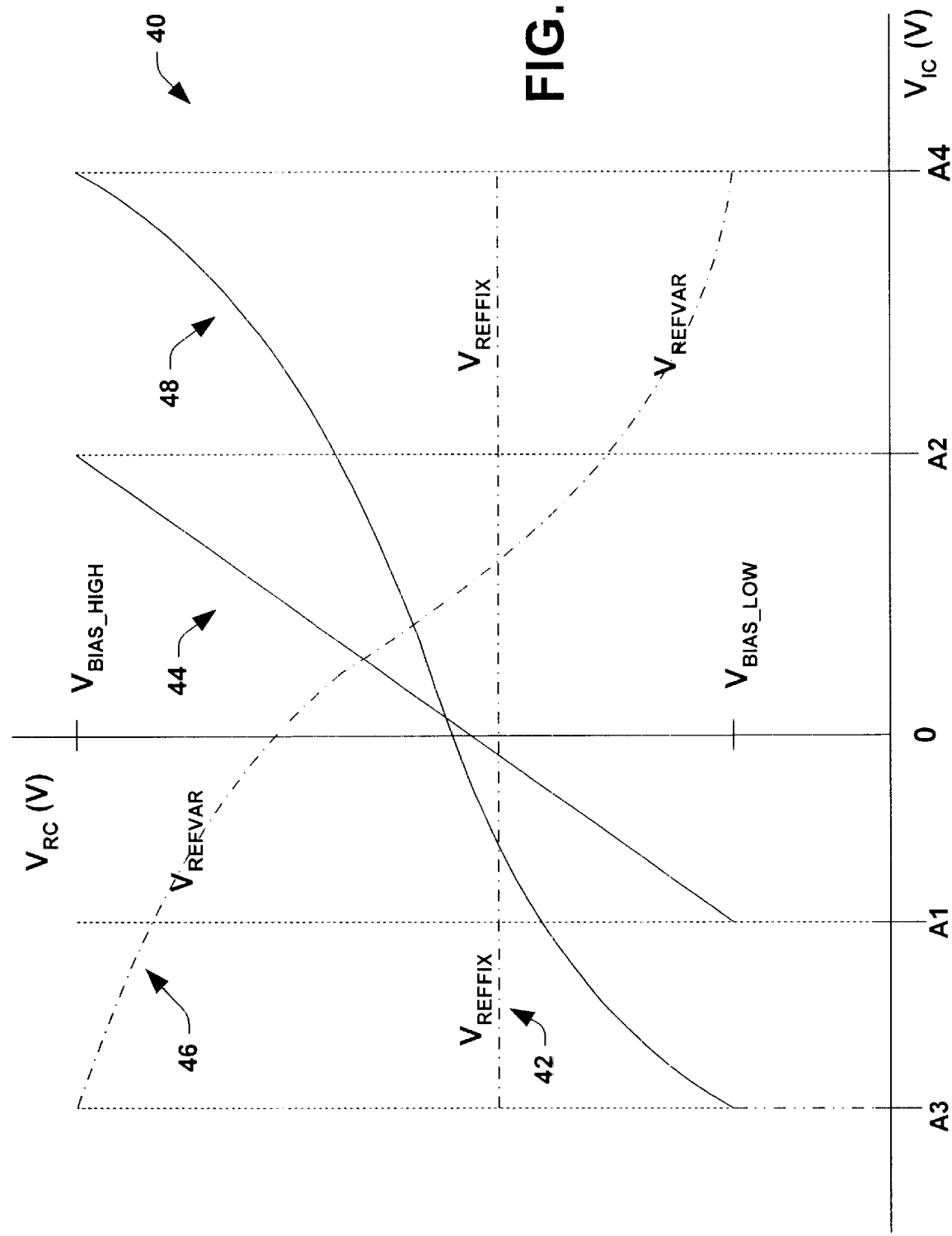
FIG. 3 illustrates a graph of an external input common mode voltage ($V_{IC}$) versus an internal common mode voltage ($V_{RC}$) of the receiver apparatus of FIG. 2.

FIG. 3 illustrates a graph 40 of an external input common mode voltage ($V_{IC}$) versus an internal common mode bias voltage ($V_{RC}$). The graph 40 illustrates responses of a common mode translation apparatus that employs a fixed reference voltage $V_{REFFIX}$, and a common mode translation apparatus that employs a variable reference voltage $V_{REFVAR}$ that varies inversely proportional to the internal common mode voltage $V_{IC}$. A constant $V_{REFFIX}$ is illustrated as dashed line 42, which provides for an internal common mode voltage or bias voltage response 44 that is linear from point A1 to A2. In an RS-485 or RS-422 application, A1 would be −7 volts and A2 would be +12 volts. The adjusted bias voltage response is applied at the input terminals of a receiver.

A variable negative feedback system in accordance with the present invention increases the common mode translation width that can be provided at the input of the apparatus by dynamically adjusting the reference voltage with respect to an internal common mode bias voltage. The variable reference voltage $V_{REFVAR}$ is illustrated as dashed line 46, which provides for an internal common mode voltage or bias voltage response 48 that is inversely proportional with the internal common mode voltage and extends from A3 to A4. In an RS-485 or RS-422 application, A3 would be −20 volts, while A4 would be +25 volts, such that a receiver operable to receive a common mode range from −7 to +12 volts can operate in a common mode range from −20 volts to +25 volts by employing the common mode translation mechanism in accordance with the present invention.

In the present invention, the common mode conversion ratio is increased while not modifying the differential signal attenuation with respect to a fixed reference voltage system. The increased common mode conversion is reflected as an increase in the common mode range of applied data signal $V_{IC}$ for a given operating common mode voltage range $V_{RC}$ for a functional circuit such as a data receiver. The present invention modifies $V_{REF}$ in an inverse relation to the $V_{IC}$ signal. The ability of the present invention to detect the $V_{IC}$ signal and modify $V_{REF}$ with a low gain amplifier makes it possible to adapt to quickly varying $V_{IC}$ signals.

Figure 4:
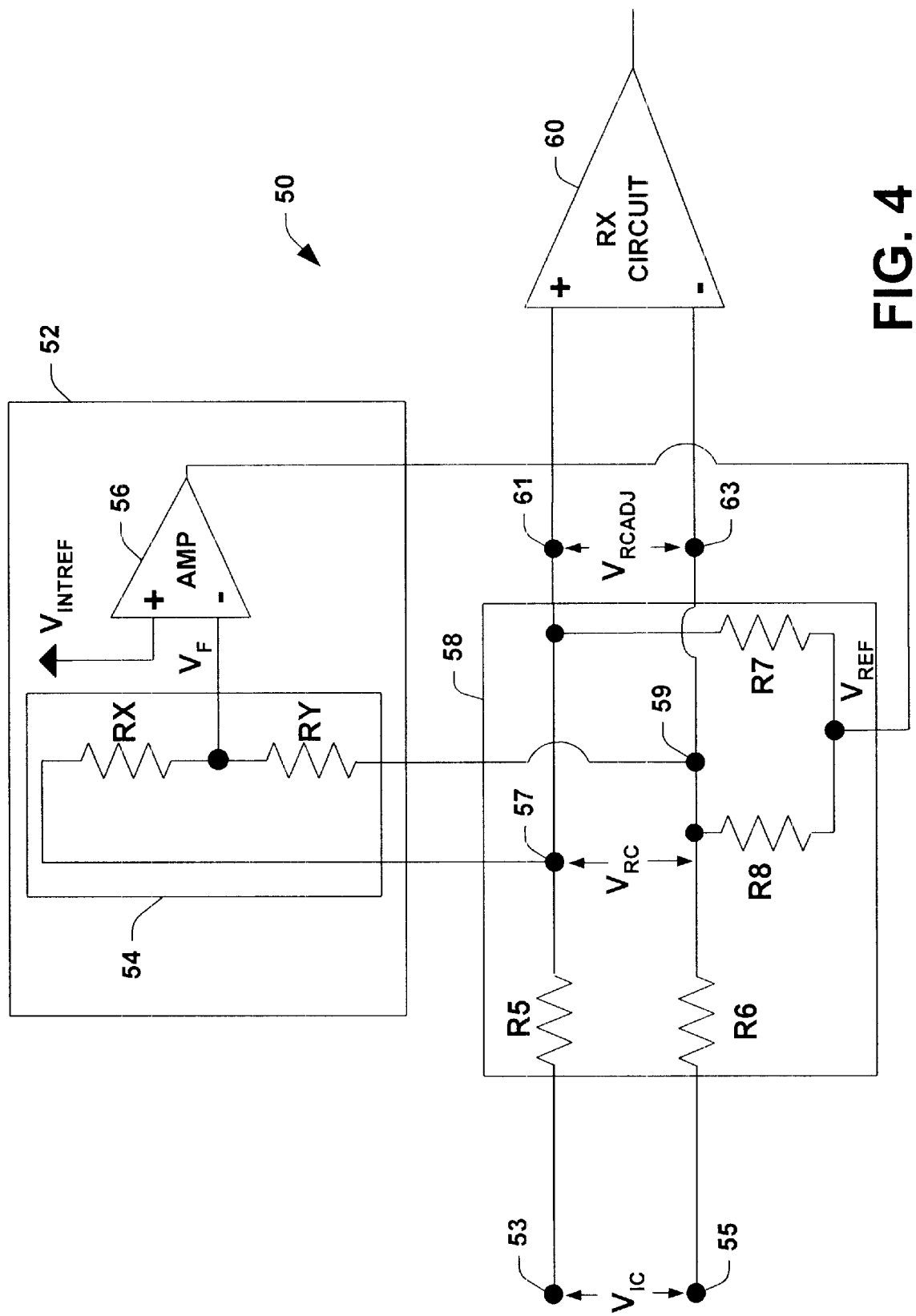
FIG. 4 illustrates a schematic block diagram of a common mode translation circuit in accordance with an aspect of the present invention.

FIG. 4 illustrates a common mode translation circuit 50 in accordance with an aspect of the present invention. The common mode translation circuit 50 includes a voltage attenuation network 58 having resistors R5, R6, R7 and R8. The common mode translation circuit 50 also includes a feedback circuit 52 that utilizes a common mode sense circuit 54 coupled to an amplifier 56. An external input common mode voltage $V_{IC}$ is provided to the voltage attenuation network 58 at input terminals 53 and 55, which are coupled to resistor R5 and R6, respectively. Resistor R5 is coupled to resistor R7 forming a first resistor divider and resistor R6 is coupled to resistor R8 forming a second resistor divider. Resistor R5 and resistor R6 have substantially the same resistance, while resistor R7 and resistor R8 have substantially same resistance. The input common mode voltage $V_{IC}$ is reduced to an internal common mode bias voltage $V_{RC}$ at internal nodes 57 and 59 by the first and second resistor dividers.

The feedback system 52 translates the internal common mode bias voltage $V_{RC}$ into an adjusted internal common mode bias voltage $V_{RCADJ}$ at output terminals 61 and 63, which is provided to the differential input of a receiver circuit 60. It is to be appreciated that the internal common mode bias voltage $V_{RC}$ and the adjusted internal common mode bias voltage $V_{RCADJ}$ are essentially the same voltage separated by an adjustment time period. However, the internal common mode bias voltage $V_{RC}$ and the adjusted internal common mode bias voltage $V_{RCADJ}$ are shown as separate voltages for illustrative purposes. The adjustment time period does not affect the functionality of the receiving circuit 60 due to internal protection devices such as diode clamps or the like. A reference control voltage $V_{REF}$ and an attenuation ratio set by the first and second resistor dividers control the translation of the common mode input voltage $V_{IC}$ into an adjusted internal common mode voltage $V_{RCADJ}$.

The common mode bias voltage $V_{RC}$ is sensed by the common mode sense circuit 54, which provides a voltage reference $V_F$ to a feedback amplifier 56. An internal reference voltage $V_{INTREF}$ provides the reference bias voltage to the amplifier 56. The amplifier 56 modifies or dynamically adjusts the $V_{REF}$ control voltage as the internal common mode bias voltage $V_{RC}$ varies. The voltage of the voltage reference $V_F$ moves in an opposite direction of the internal common mode bias voltage $V_{RC}$. The common mode sense circuit 54 is a resistor structure comprised of a first resistor element RX and a second resistor element RY for sensing the common mode input voltage to the receiver circuit 60. The two resistors RX and RY are of substantially equal resistive values and function as voltage sense elements. The output voltage is tapped from the center of resistors RX and RY, which detect the internal common mode bias voltage $V_{RC}$ at nodes 57 and 59. The input common mode voltage $V_{IC}$ is translated into an adjusted bias voltage $V_{RCADJ}$ provided at the input of the receiver circuit 60.

Figure 5:
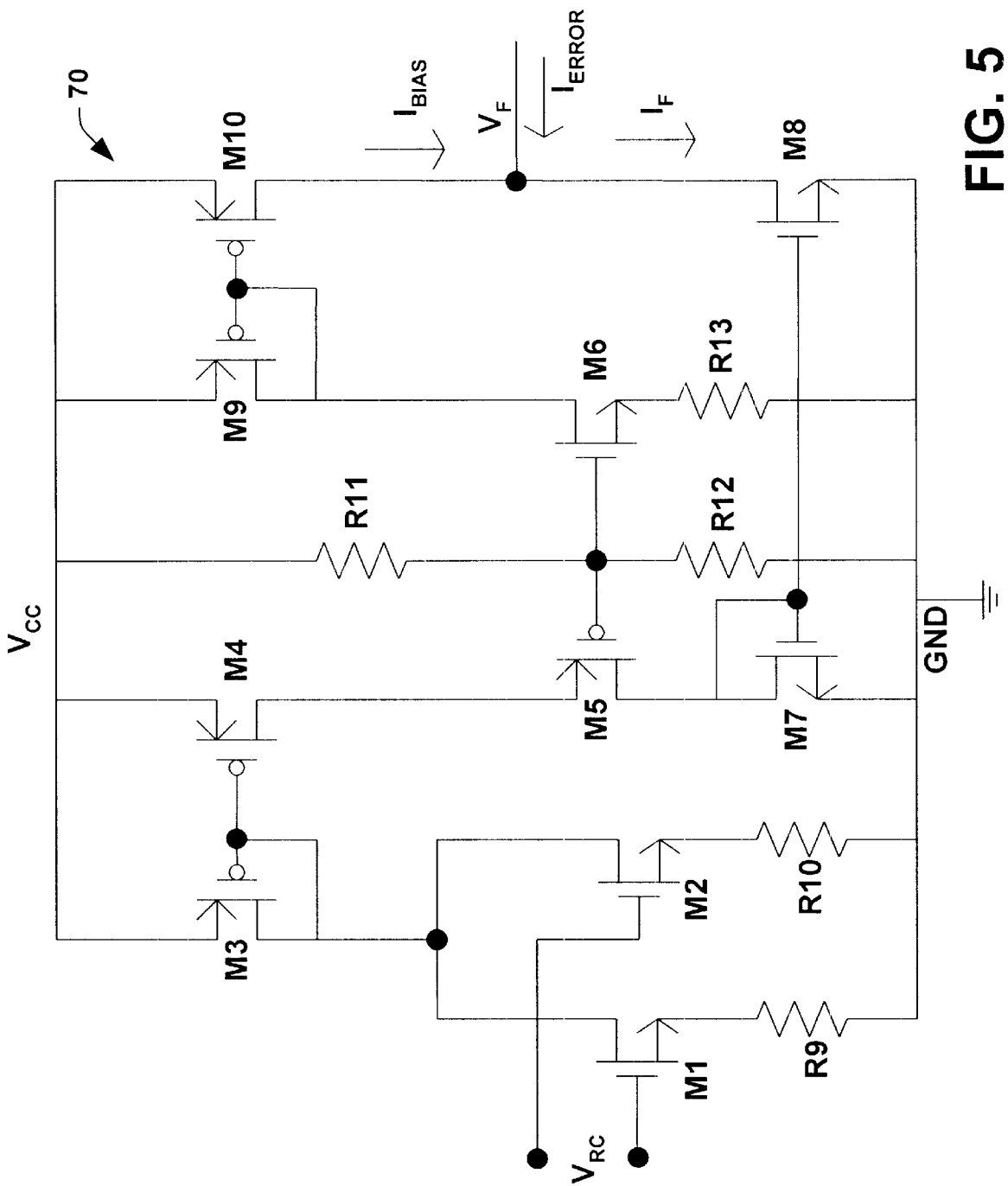
FIG. 5 illustrates a schematic diagram of a common mode sensing circuit in accordance with an aspect of the present invention.

FIG. 5 illustrates a common mode sensing device 70 in accordance with another aspect of the present invention. The common mode sensing device in FIG. 5 is one particular implementation of the common mode sense device 24 illustrated in FIG. 2. However, if the common mode sensing device 70 of FIG. 5 were used for the common mode sense device 24 in FIG. 2, the buffer amplifier 26 of FIG. 2 would have to be altered to be a non-inverting amplifier stage rather than the inverting amplifier stage as illustrated in FIG. 2. An example of such a non-inverting amplifier stage is the amplifier circuit 86 of FIG. 6.

The common mode sensing device 70 in FIG. 5 is a current comparator device that utilizes high impedance Metal-Oxide-Semiconductor (MOS) devices to sense the common mode bias voltage $V_{RC}$. The common mode sensing apparatus 70 eliminates the loading on the resistor network as compared to the common mode sensing apparatus 54 of FIG. 4. The additional performance advantage of using the common mode sensing device 70 in FIG. 5 versus the resistor elements of common mode sense circuit 54 in FIG. 4 is that the common mode sensing device 70 in FIG. 5 has a much wider bandwidth over which to sense the common mode voltage fluctuations. Therefore, the implementation of FIG. 5 for the common mode sense device will be able to react to common signals of higher frequency than the implementation of FIG. 4. The common mode sensing device 70 includes MOS devices M1 and M2, which sense the common mode bias signal $V_{RC}$. A current $I_F$, that is proportional to the common mode bias signal, is fed through MOS devices M3 mirrored to M4 and M7 mirrored to M8.

Resistors R11 and R12 set up a voltage bias point that is proportional to the supply voltage ($V_{CC}$). MOS devices M6 and R13 transform the voltage on the gate of MOS device M6 into a current. MOS device M1, resistor R9, MOS device M2 and resistor R10 are sensors of the input voltages on the differential inputs. These devices transform the voltages on their corresponding gates into currents. MOS devices M3, M4, M7 and M8 are current mirrors to mirror the input currents $I_F$ over to a $V_F$ node for current comparison to a reference current $I_{BIAS}$. MOS devices M9 and M10 mirror the reference current $I_{BIAS}$ over to the $V_F$ node. MOS device M5 is a voltage cascode that improves the accuracy of the mirror current of the MOS device M3 to MOS device M4.

In one aspect of the present invention, the sizes of resistor R9, R10 and R13 are substantially equal. The ratio of MOS devices M1, M2 and M6 are substantially equal, the ratios of MOS devices M3 and M4 are substantially equal, and the ratios of the MOS devices M7 and M8 are substantially equal. The ratio of the MOS device M10 is equal to two times that of M9.

If the currents being sourced and sunk by M10 ($I_{BIAS}$) and M8 ($I_F$), respectively, are equivalent there is no adjustment to $V_F$. If one current is greater than the other, the $V_F$ voltage will increase or decrease in an opposite relationship of the internal common mode voltage $V_{RC}$. In this way $V_{REF}$ in FIG. 2 (buffered $V_F$ voltage) will increase if $V_{RC}$ is low and decrease if the $V_{RC}$ is high. This will keep $V_{RC}$ in the common mode range of the receiver circuit of FIG. 2. The difference between the current $I_F$ and a reference current $I_{BIAS}$ (set by M6, M9 and M10) produces a current error signal $I_{ERROR}$ that modifies or dynamically adjusts the voltage $V_F$. The nominal value of $V_F$ is set by a resistor divider at the input of an amplifier circuit. The current error signal $I_{ERROR}$ is fed to the amplifier circuit, which then generates an output control voltage $V_{REF}$ that is fed to an attenuator network as previously discussed.

Figure 6:
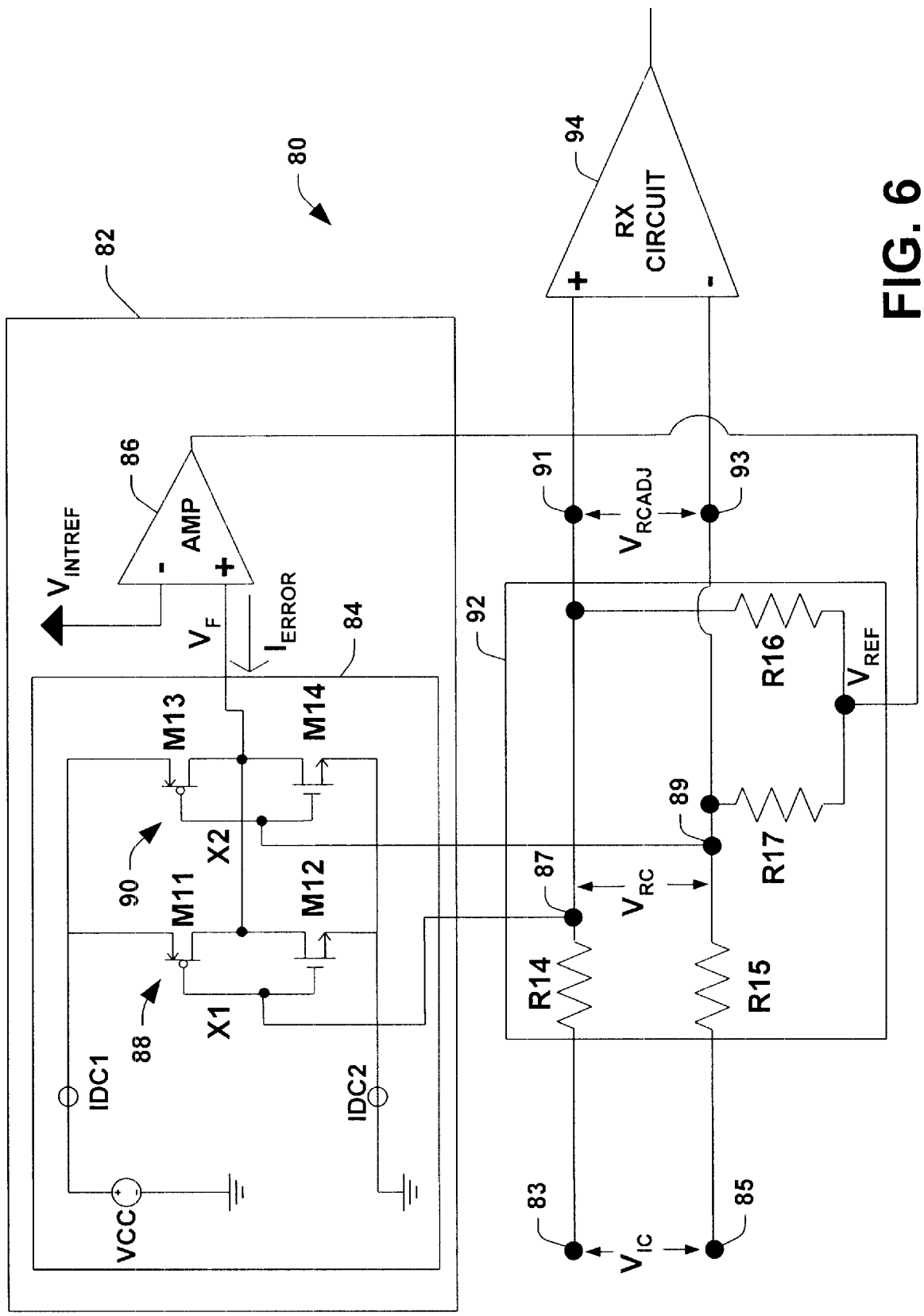
FIG. 6 illustrates a schematic block diagram of a common mode translation circuit in accordance with another aspect of the present invention.

FIG. 6 illustrates a common mode translation circuit 80 in accordance with another aspect of the present invention. The common mode translation circuit 80 includes a voltage attenuation network 92 having resistors R14, R15, R16 and R17. The common mode translation circuit 80 also includes a feedback circuit 82 that utilizes a common mode sense circuit 84 coupled to an amplifier 86. An input common mode voltage $V_{IC}$ is provided to the voltage attenuation network 92 at input terminals 83 and 85, which are coupled to resistor R14 and R15, respectively. Resistor R14 is coupled to resistor R16 forming a first resistor divider and resistor R15 is coupled to resistor R17 forming a second resistor divider. Resistor R14 and resistor R15 have substantially the same resistance, while the resistor R16 and the resistor R17 have substantially the same resistance. The input common mode voltage $V_{IC}$ is reduced to an internal common mode bias voltage $V_{RC}$ at internal nodes 87 and 89 by the first and second resistor dividers.

The feedback system 82 translates the internal common mode bias voltage $V_{RC}$ into an adjusted internal common mode bias voltage $V_{RCADJ}$ at output terminals 91 and 93, which is provided to the differential input of a receiver circuit 94. It is to be appreciated that the internal common mode bias voltage $V_{RC}$ and the adjusted internal common mode bias voltage $V_{RCADJ}$ are essentially the same voltage separated by an adjustment time period. However, the internal common mode bias voltage $V_{RC}$ and the adjusted internal common mode bias voltage $V_{RCADJ}$ are shown as separate voltages for illustrative purposes. The adjustment time period does not affect the functionality of the receiving circuit 94 due to internal protection devices such as diode clamps or the like. A reference control voltage $V_{REF}$ and an attenuation ratio set by the first and second resistor dividers control the translation of the common mode input voltage $V_{IC}$ into an adjusted internal common mode voltage $V_{RCADJ}$.

The common mode input voltage $V_{RC}$ is sensed at nodes 87 and 89 by the common mode sense circuit 84, which provides a voltage reference $V_F$ to the feedback amplifier 86. The voltage of the voltage reference $V_F$ moves in an opposite direction of the input common mode voltage $V_{IC}$ and the internal common mode voltage $V_{RC}$. The common mode sense circuit 86 is comprised of Complementary-Symmetry Metal-Oxide-Semiconductors (CMOS) inverter devices 88 and 90 that sense the common mode bias voltage $V_{RC}$. This technique employs the high impedance of MOS devices that eliminates the loading of common mode sense circuit 84 on the resistor network 92. The additional performance advantage of using the circuit in FIG. 6 versus the resistor structure of common mode sense circuit 54 in FIG. 4, for the common mode sense device, is that the circuit in FIG. 6 has a much wider bandwidth over which to sense the common mode voltage fluctuations. Therefore, the implementation of FIG. 6 for the common mode sense circuit will be able to react to common signals of higher frequency than the implementation of FIG. 4.

The CMOS inverter device 88 is comprised of a P-channel MOS transistor device M11 and an N-channel MOS transistor device M12. The CMOS inverter device 90 is comprised of a P-channel MOS transistor device M13 and an N-channel MOS transistor device M14. The P-channel MOS devices M11 and M13 have their sources coupled to a first current source IDC1, while the N-channel MOS transistor devices M12 and M14 have their sources tied to a second current source IDC2. The first current source IDC1 is also coupled to VCC, while the second current source IDC2 is also coupled to ground.

The CMOS inverter devices 88 and 90 sense the common mode signal $V_{RC}$ and provide an inverted reference signal VF relative to the sensed common mode signal. The inverted reference signal VF is fed to the negative feedback amplifier 86. The amplifier 86 modifies the $V_{REF}$ voltage in an inversely proportional relation to the $V_{IC}$ common mode voltage.

Figure 7:
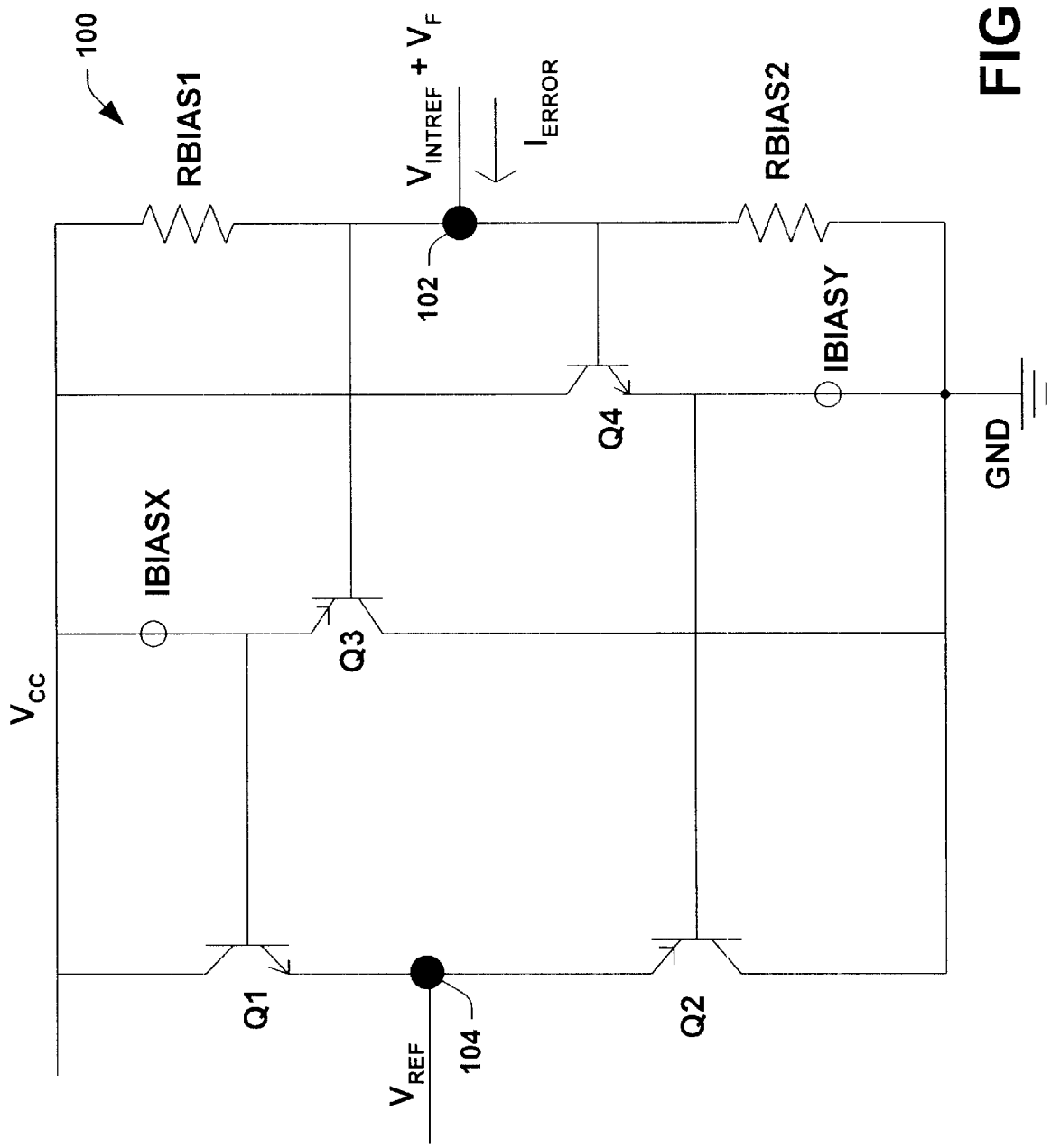
FIG. 7 illustrates a schematic diagram of an amplifier device in accordance with an aspect of the present invention.

FIG. 7 illustrates one particular amplifier device 100 that can be employed to buffer the reference voltage $V_F$ plus a bias reference voltage $V_{INTREF}$ to provide the reference control voltage $V_{REF}$ to an attenuation network as previously discussed. The amplifier device 100 is a low gain non-inverting stage amplifier circuit utilizing a class AB transconductance stage. It is to be appreciated that the negative feedback amplifier 100 can be selected from a wide variety of available amplifier topologies.

The class AB amplifier 100 is formed from a transistor quad comprised of bipolar transistor Q1, Q2, Q3 and Q4 and bias current sources IBIASX and IBIASY. Transistor Q1 and transistor Q4 are NPN transistors, while transistor Q2 and transistor Q3 are PNP transistors. The $V_{INTREF}$ voltage is provided with a simple resistor divider between $V_{CC}$ supply voltage and ground at node 102. The resistors RBIAS1 and RBIAS2 setup the reference bias voltage $V_{INTREF}$, which is provided to the inputs of Q3 and Q4. The current error signal $I_{ERROR}$ from the common mode sensing device is provided at the node 102 and modifies the reference bias voltage in order to form the reference voltage $V_F$. The reference control voltage $V_{REF}$ is tapped from node 104, which is between transistors Q1 and Q2. The amplifier 100 essentially buffers the reference $V_F$ into the reference control voltage $V_{REF}$.

It is to be appreciated that the feedback network of the present invention, which includes the common mode sense circuit and the gain circuit may include devices other than a sense circuit and a single amplifier. Other circuitry can be coupled in parallel and/or in series in order to achieve the desired electrical characteristics of the overall common mode translation circuit.

Figure 8:
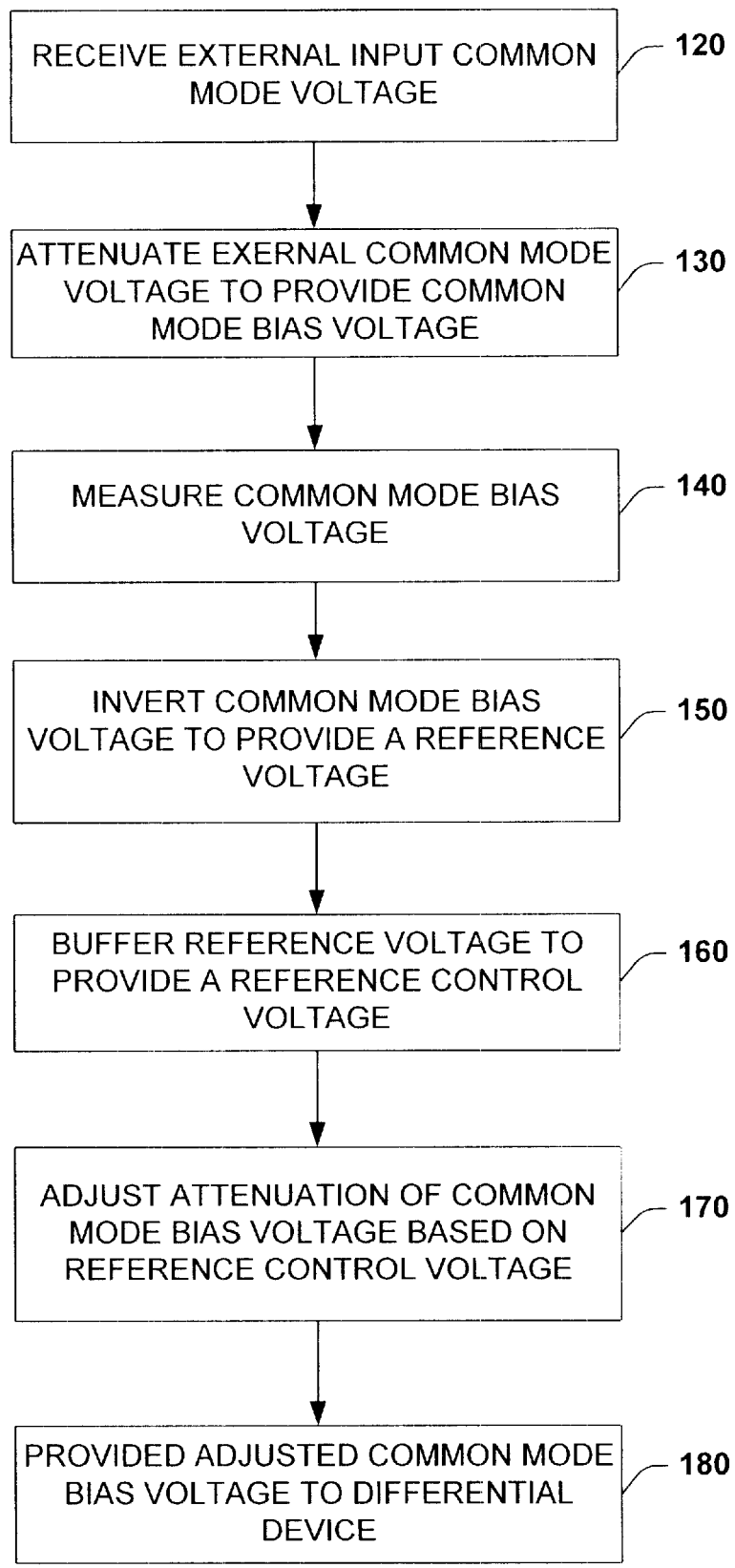
FIG. 8 illustrates a flow diagram of a methodology for common mode translation in accordance with an aspect of the present invention.

In view of the foregoing structural and functional features described above, a methodology in accordance with various aspects of the present invention will be better appreciated with reference to FIG. 8. While, for purposes of simplicity of explanation, the methodology of FIG. 8 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect the present invention.

FIG. 8 illustrates one particular methodology for translating a wide common mode voltage range into a narrow common mode voltage range in accordance with one particular aspect of the present invention. The methodology begins at 120 where an external input common mode voltage signal is received. The external input common mode voltage signal can be received at input terminals to a receiving apparatus or device. The external input common mode voltage signal is then attenuated to provide a common mode bias voltage signal at 130. The common mode bias voltage signal can be provided, for example, by attenuating the external input common mode voltage signal via an attenuation network. The attenuation network can be comprised of a pair of resistor dividers coupled to a reference control voltage. The methodology then proceeds to 140.

At 140, the common mode bias voltage is measured. The common mode bias voltage can be measured utilizing a common mode sense circuit. The common mode sense circuit can be comprised of a resistor divider component. Alternatively, a MOS device can be employed such as a current comparator or a pair of inverters, so that the attenuation of the common mode bias voltage is not loaded. The measured common mode bias voltage is then inverted to provide a reference voltage at 150. At 160, the reference voltage is buffered to provide a reference control voltage. The reference control voltage is inversely proportional to the common mode bias voltage. At 170, the attenuation of the common mode bias voltage is adjusted based on the reference control voltage. At 180, the adjusted attenuated common mode bias voltage is then provided to a differential device (e.g., a receiver, an amplifier, a comparator). The methodology illustrated in 120–180 is dynamically repeated, such that the adjusted common mode bias voltage is adjusted as the external input common mode voltage changes.

What has been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A system for translating a wide common mode voltage range into a narrow common mode voltage range, the system comprising:

an attenuation network having input terminals operative to receive a common mode voltage signal;

a feedback system coupled to the attenuation network, the feedback system measuring the attenuated common mode voltage signal and adjusting the attenuated common mode voltage signal to a level that can be accommodated by an input of a differential device;

wherein the feedback system includes a common mode sense device that measures the attenuated common mode voltage signal and dynamically adjusts a reference voltage corresponding to the measured common mode voltage signal; and wherein the common mode sense device comprising a MOS structure that mitigates loading of the attenuation network and provides a wider bandwidth over which to sense common mode voltage fluctuations.

2. The system of claim 1, the attenuation network providing a common mode bias voltage that is dynamically adjusted by the feedback system.

3. The system of claim 1, the feedback system further comprising an amplifier device operative for receiving the reference voltage from the common mode sense device and providing a reference control voltage that is coupled to the attenuation network, the reference control voltage facilitating the adjustment of the attenuated common mode voltage signal to accommodate the input of the differential device.

4. The system of claim 3, the reference control voltage being inversely proportional to the input common mode voltage signal.

5. The system of claim 1, the common mode sense device comprising a resistor divider structure.

6. The system of claim 1, the common mode sense device comprising a current comparator.

7. The system of claim 1, the common mode sense device comprising a first inverter and a second inverter structure.

8. A voltage translation apparatus for translating a wide common mode voltage range into a narrow common mode voltage range, the apparatus comprising:

an attenuation network having input terminals operative to receive a common mode voltage signal;

a common mode sense circuit that measures the attenuated common mode voltage signal and dynamically adjusts a reference voltage corresponding to the attenuated common mode voltage signal;

a buffer device that receives the reference voltage and provides a reference control voltage to the attenuation network, the attenuated common mode voltage signal being adjusted relative to the reference control voltage;

wherein the attenuation network provides a common mode bias voltage that is dynamically adjusted relative to the reference control voltage; and wherein the common mode sense circuit includes a NMOS current comparator that converts the common mode bias voltage into a current that is compared with a reference current to dynamically adjust the reference voltage.

9. The apparatus of claim 8, the reference control voltage being inversely, proportional to the attenuated common mode bias voltage.

10. A voltage translation apparatus for translating a wide common mode voltage range into a narrow common mode voltage range, the apparatus comprising:

an attenuation network having input terminals operative to receive a common mode voltage signal;

a common mode sense circuit that measures the attenuated common mode voltage signal and dynamically adjusts a reference voltage corresponding to the attenuated common mode voltage signal; and a buffer device that receives the reference voltage and provides a reference control voltage to the attenuation network, the attenuated common mode voltage signal being adjusted relative to the reference control voltage;

wherein the common mode sense circuit includes a first CMOS inverter and a second CMOS inverter structure coupled to both first and second current sources.

11. The apparatus of claim 10 in combination with a differential device, the differential device operative to receive common mode voltage signals in a the narrow common mode voltage range and the apparatus translating the attenuated common mode voltage signals from the wide common mode voltage range into the narrow common mode voltage range.

12. The apparatus of claim 10 forming part of an integrated circuit.

* * * * *